(12) United States Patent
Zhang et al.

(10) Patent No.: US 8,174,131 B2
(45) Date of Patent: May 8, 2012

(54) SEMICONDUCTOR DEVICE HAVING A FILLED TRENCH STRUCTURE AND METHODS FOR FABRICATING THE SAME

(75) Inventors: Zhen Zhang, Santa Clara, CA (US); Frank Kuechenmeister, Dresden, DE (US); Jaime Bravo, Santiago (CL); Michael Su, Round Rock, TX (US); Ranjit Gannamani, San Jose, CA (US); Kevin Lim, Sunnyvale, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/472,884

(22) Filed: May 27, 2009

(65) Prior Publication Data
US 2010/0301460 A1  Dec. 2, 2010

(51) Int. Cl.
*H01L 23/495* (2006.01)
*H01L 29/40* (2006.01)
*H01L 23/29* (2006.01)
*H01L 21/00* (2006.01)

(52) U.S. Cl. ......... 257/790; 257/669; 257/778; 438/108
(58) Field of Classification Search .......... 438/108; 257/669, 778, 790
See application file for complete search history.

(56) References Cited

U.S. PATENT DOCUMENTS

| | | | | |
|---|---|---|---|---|
| 4,135,291 A * | 1/1979 | Tursky et al. | | 438/17 |
| 5,287,003 A * | 2/1994 | Van Andel et al. | | 257/792 |
| 5,736,453 A * | 4/1998 | Kadonishi | | 438/460 |
| 6,011,301 A * | 1/2000 | Chiu | | 257/678 |
| 6,091,138 A * | 7/2000 | Yu et al. | | 257/686 |
| 6,200,888 B1 * | 3/2001 | Ito et al. | | 438/597 |
| 6,809,423 B1 * | 10/2004 | Mithal et al. | | 257/778 |
| 7,067,358 B2 * | 6/2006 | Chen-Tung et al. | | 438/127 |
| 7,250,354 B2 * | 7/2007 | Uchida | | 438/460 |
| 7,271,496 B2 * | 9/2007 | Kim | | 257/778 |
| 7,355,577 B1 | 2/2008 | Daubenspeck et al. | | |
| 7,518,220 B2 * | 4/2009 | Kroehnert et al. | | 257/676 |
| 7,659,202 B2 * | 2/2010 | Trezza | | 438/675 |
| 7,683,482 B2 * | 3/2010 | Nishida et al. | | 257/737 |
| 7,808,105 B1 * | 10/2010 | Paek | | 257/750 |
| 7,880,301 B2 * | 2/2011 | Imori | | 257/739 |
| 8,063,478 B2 * | 11/2011 | Takahashi | | 257/686 |
| 2002/0140107 A1 * | 10/2002 | Kato et al. | | 257/777 |
| 2005/0046002 A1 * | 3/2005 | Lee et al. | | 257/678 |
| 2007/0001293 A1 * | 1/2007 | Jiang et al. | | 257/720 |
| 2007/0037319 A1 * | 2/2007 | Chan et al. | | 438/108 |
| 2007/0048902 A1 * | 3/2007 | Hiatt et al. | | 438/108 |
| 2007/0052080 A1 * | 3/2007 | Chen | | 257/686 |
| 2007/0096337 A1 * | 5/2007 | Choi | | 257/778 |
| 2008/0096316 A1 * | 4/2008 | Tan et al. | | 438/109 |
| 2008/0284003 A1 * | 11/2008 | Kwang et al. | | 257/724 |
| 2009/0057922 A1 * | 3/2009 | Lee et al. | | 257/778 |
| 2009/0184403 A1 * | 7/2009 | Wang et al. | | 257/659 |
| 2010/0041180 A1 * | 2/2010 | Oliver et al. | | 438/109 |

\* cited by examiner

*Primary Examiner* — James Mitchell
(74) *Attorney, Agent, or Firm* — Ingrassia Fisher & Lorenz, P.C.

(57) ABSTRACT

Methods are provided for packaging a semiconductor die having a first surface. In accordance with an exemplary embodiment, a method comprises the steps of forming a trench in the first surface of the die, electrically and physically coupling the die to a packaging substrate, forming a sealant layer on the first surface of the die, forming an engagement structure within the trench, and infusing underfill between the sealant layer and the engagement structure and the packaging substrate.

20 Claims, 6 Drawing Sheets

SEMICONDUCTOR DEVICE HAVING A FILLED TRENCH STRUCTURE AND METHODS FOR FABRICATING THE SAME

FIELD OF THE INVENTION

The present invention generally relates to semiconductor devices and methods for fabricating semiconductor devices, and more particularly relates to semiconductor devices having a filled trench structure, and methods for fabricating such semiconductor devices.

BACKGROUND OF THE INVENTION

A multitude of semiconductor devices are typically fabricated on a single semiconductor wafer. Following a fabrication process sequence, individual devices or "die" are typically separated or "diced" from the wafer by sawing or laser scribing. These die are then incorporated within a packaging structure generally designed to seal the active area of the die and electrically interconnect device terminals with those of an external circuit. When devices are packaged using flip-chip bonding, solder beads or "bumps" are reflowed and used to connect conductive terminal recesses on the device to metal leads within the package. The active side of the device including the soldered interconnects is then encapsulated by an underfilling sealant that, when cured, provides an environmentally resistant barrier.

However, such a packaging process has drawbacks. The dicing process can potentially generate cracks at edges of a die that may propagate through device layers into the active region and/or break through solder connections and lead to device failure. Further, because the adhesive bond between the underfilling sealant and surface passivation layers of the device is often weak, delamination at this interface may occur, exposing the active region to potentially damaging environmental incursions. To alleviate these problems, sealing structures that circumscribe the outer surface of the active region have been incorporated into the design layout of many semiconductor devices. These structures are typically made from materials such as copper or aluminum that have improved adhesion to underfilling sealants, and higher fracture toughness more suitable for terminating interlayer crack propagation. However, these structures are still susceptible to cracking and provide only marginal additional adhesive bond strength. Therefore, a more robust system is desirable to address both failure modes and provide improved reliability in such devices.

Accordingly, it is desirable to provide semiconductor devices having filled trench structures designed to terminate interlayer crack propagation and improve adhesion to a packaging sealant. Further, it is also desirable to provide methods for fabricating such semiconductor devices. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with exemplary embodiments of the invention, methods for fabricating a semiconductor die are provided. One exemplary method comprises providing a semiconductor die having a first surface, forming a trench in the first surface of the die, and electrically and physically coupling the die to a packaging substrate. The method also comprises forming a sealant layer on the first surface of the die, forming an engagement structure within the trench, and infusing underfill between the sealant layer and the engagement structure and the packaging substrate.

In accordance with a further exemplary embodiment of the invention, a method is provided of fabricating a semiconductor die. The method comprises the steps of providing a semiconductor die having a first surface and an active region, forming a trench in a first surface outside of the active region, and forming a first sealant layer on the first surface. The method also comprises forming a filled trench structure within the trench, electrically and physically coupling the active region of the semiconductor die to a packaging substrate, and forming a second sealant layer disposed between the filled trench structure and the packaging substrate.

In accordance with yet another exemplary embodiment of the invention, an electronic device is provided. The device comprises a packaging substrate, a semiconductor die having a trench formed in a first surface, wherein the first surface is electrically and physically coupled to the packaging substrate, and a sealant layer disposed in the trench and between the packaging substrate and the first surface of the semiconductor die.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

The various embodiments of the present invention provide semiconductor devices having filled trench structures, and describe methods for fabricating such semiconductor devices. A trench is formed outside of the active region in the surface of a semiconductor die and is subsequently filled with a cured sealant to form a filled trench structure. The filled trench structure is resistant to fracturing and provides a barrier to cracks that might otherwise propagate from the edge of the die into the active region. The mechanical engagement to the die provided by the filled trench structure anchors the cured sealant to the surface of the die, improving the adhesive strength of the sealant to the die and inhibiting delamination at the die/sealant interface. Accordingly, the filled trench structure increases device reliability by providing a more crack resistant and durable seal for the device package.

FIGS. 1-8 illustrate schematically, in cross-section, a semiconductor device and methods for fabricating a semiconductor device having a filled trench structure, in accordance with an exemplary embodiment of the invention. While the fabrication of one semiconductor device is illustrated, it will be appreciated that the methods depicted in FIGS. 1-8 can be used to fabricate any number of such devices. Various steps in the fabrication of semiconductor devices are well known and so, in the interest of brevity, many conventional steps will only be mentioned briefly herein or will be omitted entirely without providing the well known process details.

Figure 1:
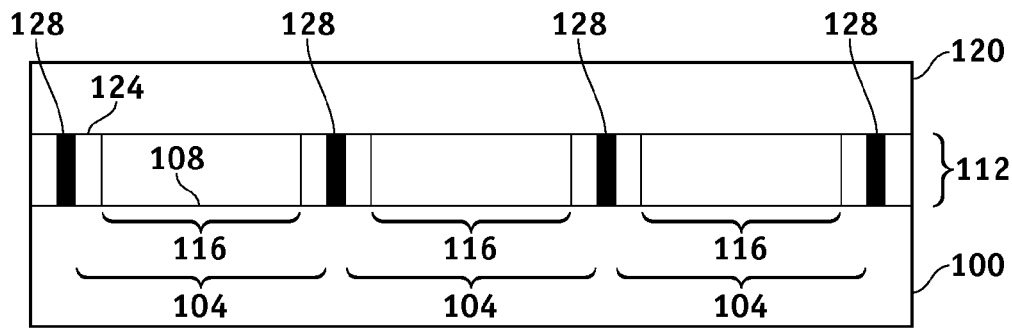
FIGS. 1-8 illustrate schematically, in cross-section, a semiconductor device and methods for fabricating a semiconductor device having a filled trench structure in accordance with an exemplary embodiment of the present invention.

Referring to FIG. 1, in accordance with an exemplary embodiment, these methods begin by providing a semiconductor substrate 100. The semiconductor substrate can be silicon, germanium, a III-V material such as gallium arsenide, or another semiconductor material. The semiconductor substrate may be a bulk wafer or may be of a layered configuration such as, for example, a silicon-on-insulator (SOI) configuration comprising a thin layer of monocrystalline silicon on an insulating layer supported by a monocrystalline silicon carrier wafer.

A plurality of substantially identical individual semiconductor devices (or die) 104 are fabricated into and/or overlying a surface 108 of semiconductor substrate 100. While substrate 100 is illustrated as having three individual die, it is understood that any number of die may be fabricated using a single substrate depending upon the area of each die and that of the substrate. Each of die 104 includes any number of layers of different materials, such as semiconductor materials, dielectrics, and conductive metal layers, etc., used for the formation of a plurality of operational device features including but not limited to, conductive traces, interconnecting plugs, circuit elements etc., and the like. For simplicity and ease of description, these detailed layers are grouped collectively and depicted in the figures as BEOL (back end of line) layer 112. The different layers contained within BEOL layer 112 can be used to form individual active elements, e.g., transistors, diodes, electrical contacts, conductive terminals, interlayer connections, and other features that are commonly found in semiconductor devices.

Each of die 104 includes an active region 116 within BEOL layer 112 containing the elements needed for functionality of the device. BEOL layer 112 also includes a plurality of scribe regions 128 that circumscribe the periphery of each of devices 104 providing a sacrificial region through which individual die may be diced. BEOL layer 112 is blanket capped by at least one protective, non-conducting passivation layer 120 comprising a suitable dielectric material such as, for example, silicon oxide ($SiO_x$) or silicon nitride ($Si_xN_y$) at a surface 124 thereof.

Figure 2:
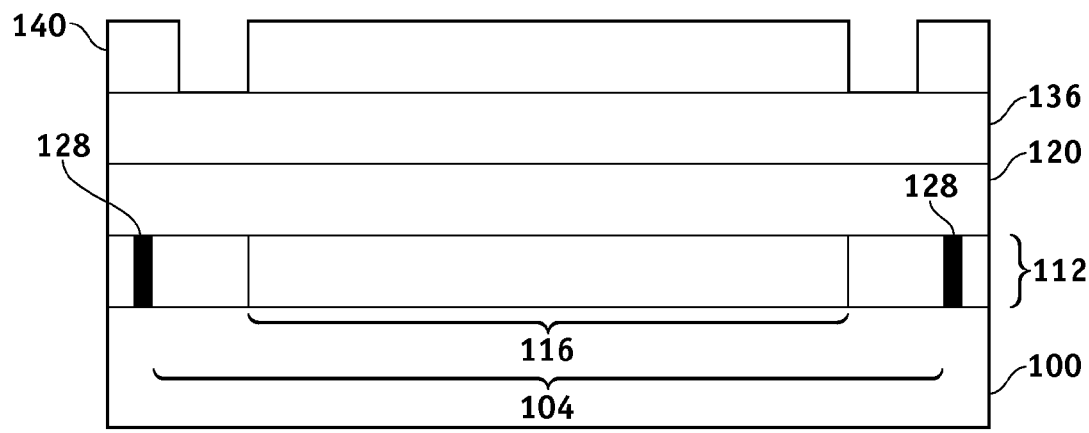

Because each of the die 104 on substrate 100 receives the same processing steps, for the sake of clarity, these steps will hereinafter be described and illustrated in the context of a single die 104, as illustrated in FIG. 2. A hard mask layer 136 is formed overlying passivation layer 120. Hard mask layer 136 may comprise a deposited silicon oxide, a silicon nitride, or silicon oxynitride (SiON), or another material having a thickness suitable for providing masking protection during a subsequent etch of BEOL layer 112 and passivation layer 120. Hard mask layer 136 may be blanket-deposited, for example, by chemical vapor deposition (CVD), low pressure chemical vapor deposition (LPCVD), or plasma enhanced chemical vapor deposition (PECVD). In one embodiment, hard mask layer 136 comprises a silicon nitride having a thickness of from about 20 nanometers (nm) to about 100 nm, and preferably is about 50 nm thick. The thickness chosen for layer 136 will depend upon factors that include the depth of a trench etched subsequently using layer 136 as a hard mask, and the selectivity of the etch process used. A patterned soft mask 140 then is formed overlying hard mask layer 136 using a suitable lithographic process. Soft mask 140 will be subsequently used to pattern hard mask layer 136, and therefore may have any thickness adequate for this purpose.

Figure 3:
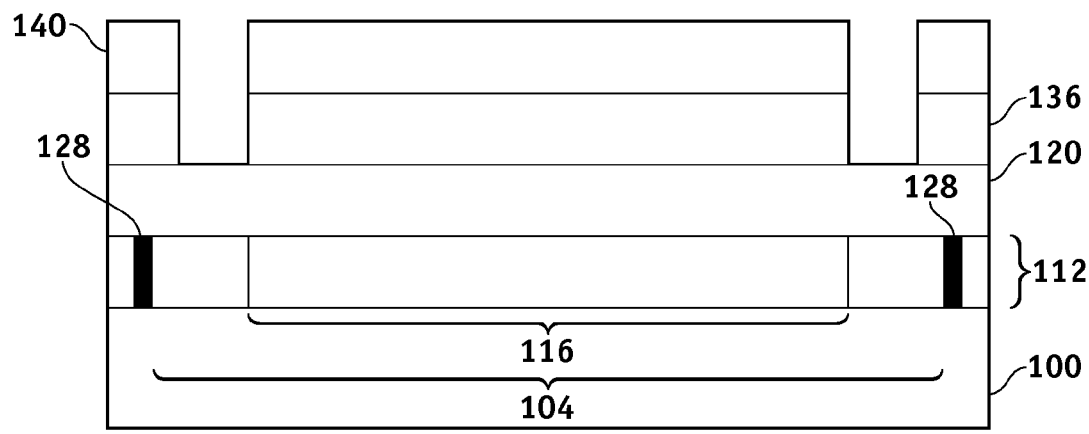

Next, hard mask layer 136 is anisotropically etched using a plasma or reactive ion etch (RIE) process using patterned soft mask 140 as an etch mask, as illustrated in FIG. 3. The RIE process chemistry used depends on the material selected for hard mask layer 136 and may be based on, for example, $CHF_3$, $CF_4$ or $SF_6$ for both silicon oxide/dioxide, or silicon nitride. Any of patterned soft mask 140 that remains following this etch may either be retained and used for a subsequent etch of BEOL layer 112 and passivation layer 120, discussed in more detail below, or may optionally be removed using an oxygen-based ashing process.

Figure 4:
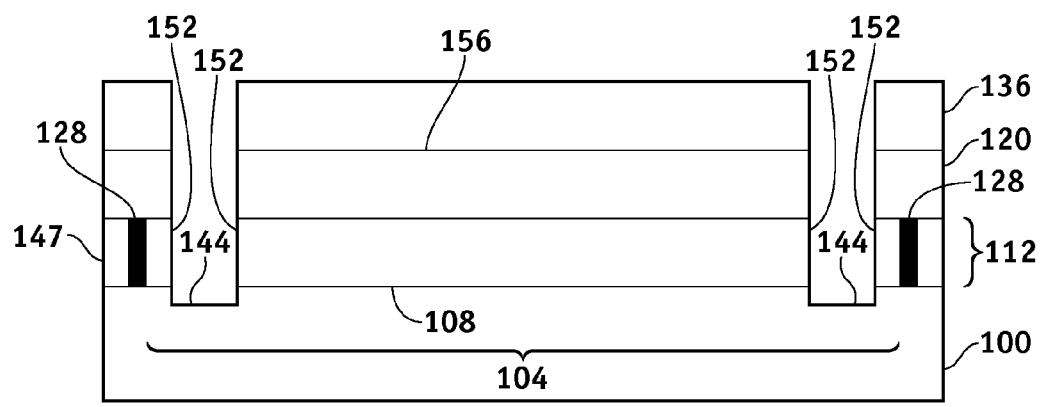

In one exemplary embodiment, a trench 144 is etched through passivation layer 120 and BEOL layer 112 to substrate surface 108 using hard mask layer 136 as an etch mask, as illustrated in FIG. 4. Because BEOL layer 112 may comprise any number of layers, this etch will be tailored for the specific layer stack contained therein. Ideally, the design for die 104 in the region allocated for trench 144 contains only silicon-comprising layers such as for example, silicon oxides and silicon nitrides, and does not contain metal-comprising layers. Such a design is desirable so that etching through BEOL and passivation layers 112 and 120 can be performed without significant changes to the chemistries and processing parameters used for the etch. In one embodiment, (as illustrated), trench 144 is etched anisotropically such that the sidewalls of trench 144 are substantially perpendicular to the surface 108. Such an etch may be performed using one or more dry etch processes that may be based upon, for example, a $CHF_3/O_2$ chemistry to etch silicon oxides, or a $CHF_3$ chemistry to etch silicon nitrides. In another embodiment, trench 144 is anisotropically etched into silicon substrate 100 (as illustrated) using, for example, an RIE process based upon an $HBr/O_2$ chemistry. Trench 144 has dimensions suitable for the subsequent formation of a filled trench structure that mechanically engages BEOL layer 112 and passivation layer 120 providing a barrier to interlayer crack propagation from an edge 147 of die 104 through these layers and improving adhesive bond strength to a sealant, as described more fully below. In one embodiment, trench 144 has a depth of from about 1 micron (μm) to about 150 μm, and preferably extends through the BEOL layer 112 into silicon substrate 100. In another embodiment, trench 144 has a width of from about 100 nm to about 1 millimeter (mm), and preferably is about 5 μm to about 10 μm in width. The width will depend upon factors that include the amount of available space between active region 116 (FIG. 3) and scribe regions 128, and the viscosity of a sealant, to be described more fully below, used to form a filled trench structure. Further, when the sealant layer used to fill the trench contains particulate fillers, the width of trench 144 may be adjusted so as to accommodate the particle size and allow the sealant to flow into and fill the trench. Next, any remainder of hard mask layer 136 is removed using a suitable selective etch process that etches layer 136 substantially faster than passivation layer 120.

Figure 5:
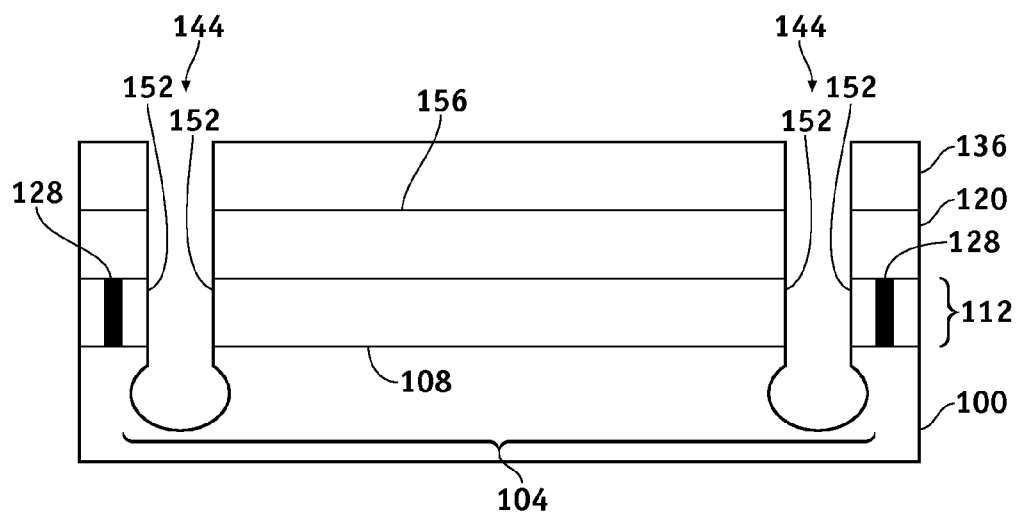

In another embodiment, the profile of trench 144 includes both isotropic and anisotropic components, as illustrated in FIG. 5. To achieve such a profile, BEOL and passivation layers 112 and 120 are anisotropically etched using a dry etch process as described above. Subsequently, a wet etch process is used to isotropically increase both the depth and width of trench 144 below BEOL layer 112 and within silicon substrate 100. This etch process may be performed using, for example, an aqueous mixture of hydrofluoric acid (HF) and nitric acid ($HNO_3$) for a suitable time depending upon etch rate and the desired final trench profile. As will be described in greater detail below, trench 144 is used in the formation of a filled trench structure that mechanically engages the surface of die 104. By adding an isotropic component to the profile of trench 144, mechanical interlocking between the sealant and die 104 may be further enhanced.

Figure 6:
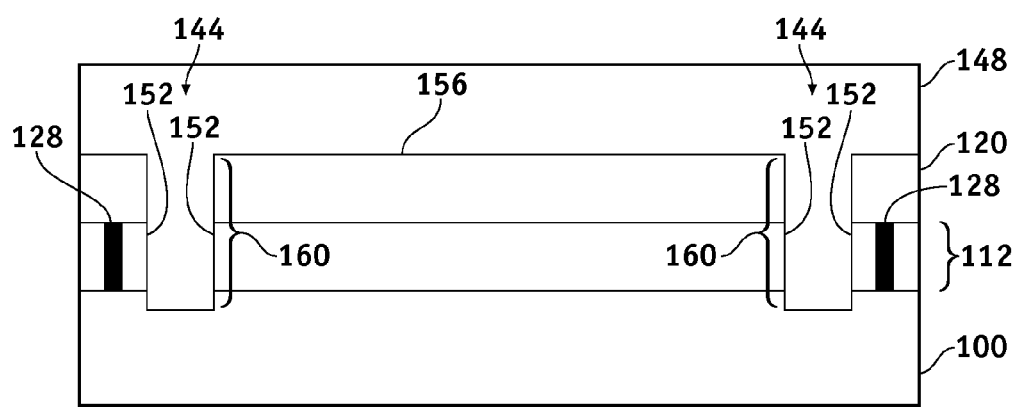

Following etching, as illustrated in either FIG. 4 or FIG. 5, trench 144 has a surface 152, and passivation layer 120 has a surface 156. The method continues, as illustrated in FIG. 6, with the formation of a sealant layer 148 overlying passivation layer 120 and within trench 144. Sealant layer 148 may be any suitable non-conducting material that fills trench 144 and adheres to and provides environmental protection for surface 152 of trench 144 and surface 156 of passivation layer 120. Ideally, the material chosen for sealant layer 148 should form a tough, fracture resistant, filled trench structure 160. For example, in one embodiment, sealant layer 148 is a polyimide that may be applied using any suitable process such as, for example, a spin coating and post application bake sequence. Filled trench structure 160 assumes the shape of trench 144 and thus, when cured, forms a solidified and conformal structure mechanically engaged with BEOL layer 112, passivation layer 120, and substrate 100.

Figure 7:
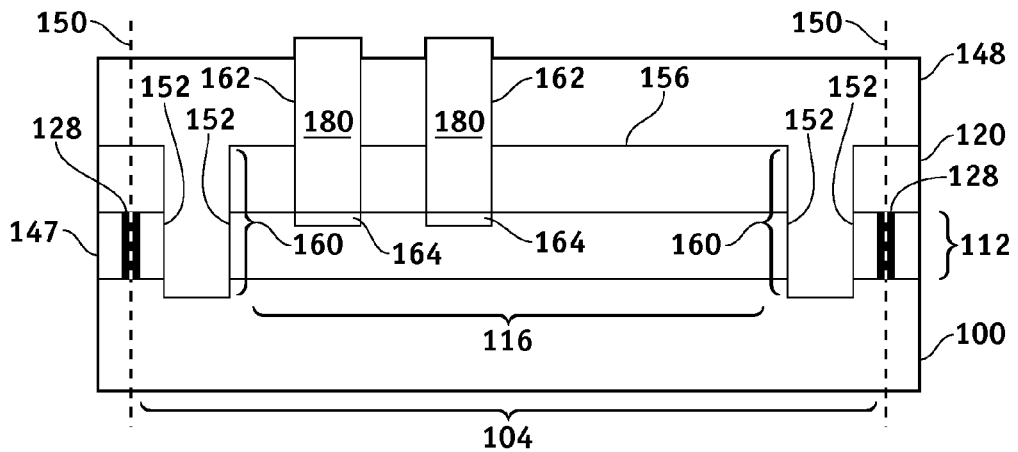

Openings 162 are formed through passivation layer 120 and sealant layer 148 to access conductive terminals 164, not previously illustrated, but included as one of the elements found in a top metal layer of BEOL layer 112, as illustrated in FIG. 7. In one embodiment, sealant layer 148 is a photo-imageable polyimide and openings 162 are formed using a lithographic patterning of sealant layer 148 followed by a dry etch of passivation layer 120 using layer 148 as an etch mask. In accordance with one embodiment, following additional well know processing steps including those that increase the depth of openings 162, solder bumps 180 then are formed in these openings, and provide electrical contact with terminals 164. Solder bumps 180 are used to electrically connect die 104 to a packaging substrate, as described in greater detail below. Substrate 100 is then diced through scribe regions 128 (as referenced by dotted lines 150) to singulate die 104 using a suitable sawing or laser scribing process. Filled trench structure 160 provides a fracture resistant barrier to cracks that may propagate from die edge 147 through BEOL layers 112 and/or passivation layer 120. Filled trench structure 160 also provides an anchor at an interface 172 between sealant layer 148 and passivation layer 120 that improves adhesive bond strength therebetween, thus improving environmental sealing and device reliability.

Figure 8:
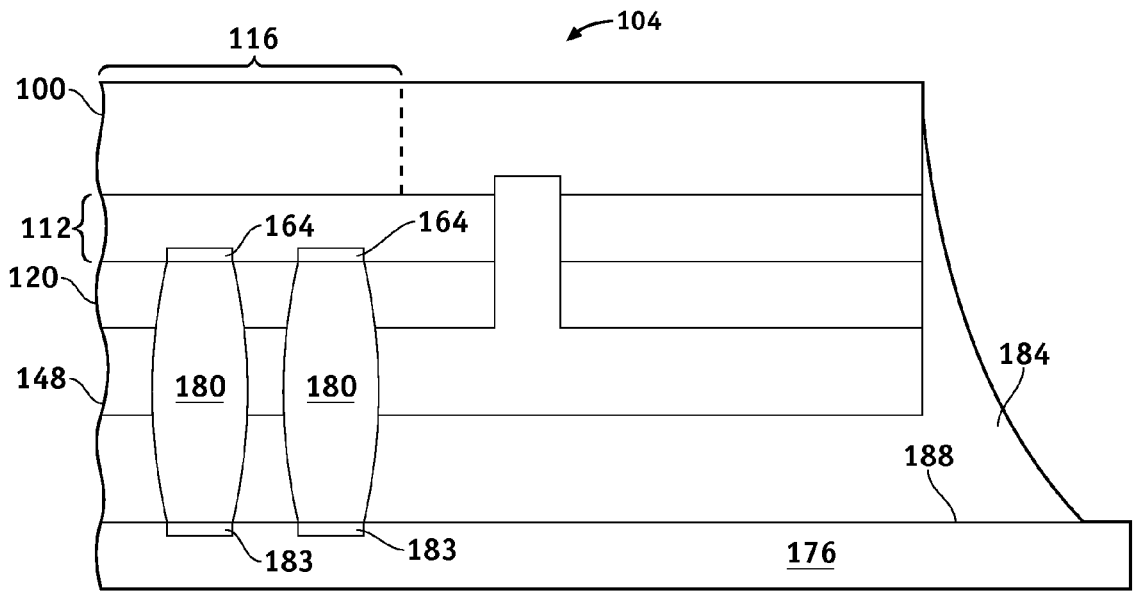

Next, die 104 is inverted and solder bonded to a packaging substrate 176 using a flip-chip bonding process, as illustrated in FIG. 8. Because the details pertaining to flip-chip bonding processes are well known, only a portion of die 104 is shown, and only those details that pertain to the invention will be discussed in detail. Solder bumps 180 are aligned with and soldered to conductive terminals 183 within packaging substrate 176. Next, a suitable underfilling sealant 184 comprising an electrically insulating adhesive material such as, for example, Hitachi 3730 (available from Hitachi Inc.), Shin-Etsu SMC375TE-T12 (Shin-Etsu Chemical Co.), Namics 2BD, or Namics 119 (Namics Corp.) is injected between sealant layer 148 and a surface 188 of packaging substrate 176. Underfilling sealant 184 flows by capillary forces between these surfaces and fills gaps between solder bumps 180. Underfilling sealant 184 then is oven cured using a suitable baking process to harden sealant 184 and enhance adhesive bonding to surface 188 and a surface 190 of sealant layer 148.

Figure 9:
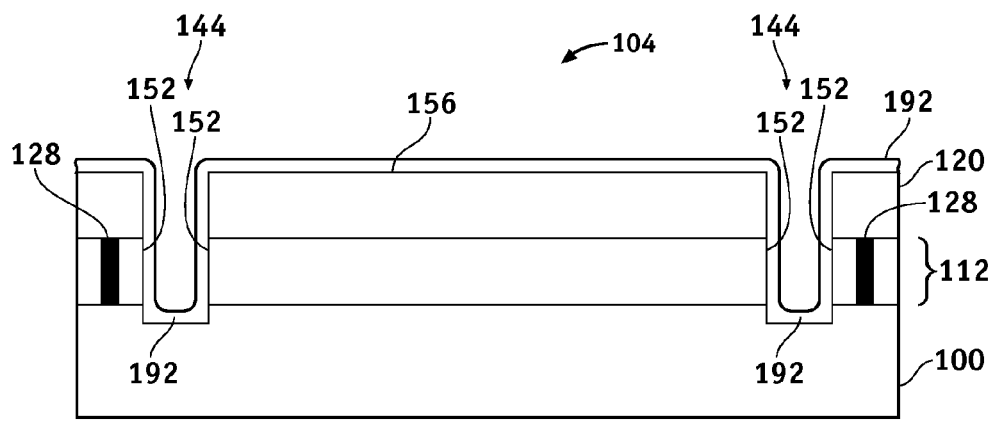
FIGS. 9-11, in conjunction with FIGS. 1-5, illustrate schematically, in cross-section, a semiconductor device and methods for fabricating a semiconductor device having a filled trench structure in accordance with another exemplary embodiment.
Figure 10:
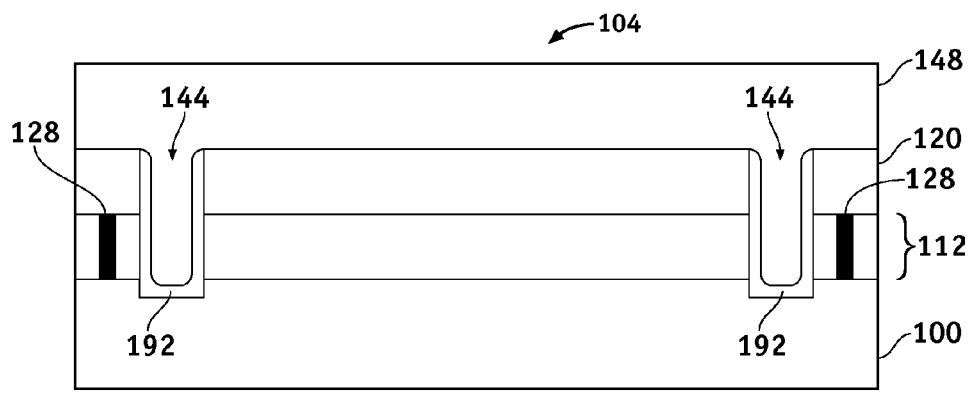
Figure 11:
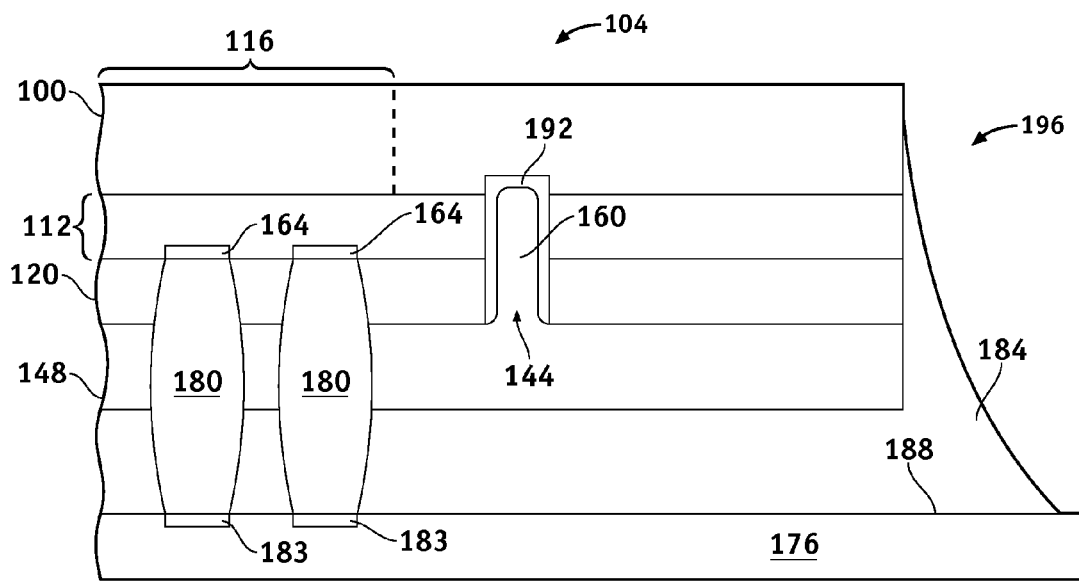

In another exemplary embodiment illustrated in FIGS. 9-11, a liner layer is formed overlying side and bottom surfaces of trench 144 to promote adhesion between filled trench structure 160 and surfaces 152 of trench 144 and/or act as a diffusion barrier for moisture and/or oxygen. This method begins with steps that are illustrated in FIGS. 1-4 or FIGS. 1-5, and previously described. Following the formation of trench 144 and the removal of hard mask layer 136, a liner layer 192 is blanket deposited over the surfaces 156 and 152 of passivation layer 120 and trench 144, respectively, as illustrated in FIG. 9. Liner layer 192 may be any suitable material that promotes adhesion between sealant layer 148 (FIG. 6) and surface 152 of trench 144. Because surface 152 contains edges of layers contained within BEOL layer 112 exposed by the formation of trench 144, liner layer 192 may comprise any material that passivates these edges and provides an improved seal at the interface with sealant layer 148. In one embodiment, liner layer 192 comprises a silicon nitride, blanket-deposited by any of the processes previously described with reference to hard mask layer 136. In another embodiment, liner layer 192 may comprise tantalum (Ta), tantalum nitride (TaN), tantalum silicon nitride (TaSiN), rhenium (Re), titanium (Ti), titanium nitride (TiN), titanium tungsten (TiW), chromium (Cr), chromium copper (CrCu), cobalt (Co), cobalt tungsten (CoW), or cobalt tungsten phosphate (CoWP) deposited using a suitable physical vapor deposition (PVD) or CVD process.

Next, liner layer 192 is removed from all regions except from surfaces 152 within trenches 144 using a suitable lithography and etch process sequence, as illustrated in FIG. 10. Sealant layer 148 may then be applied overlying passivation layer 120 and liner layer 192 using an application process previously described. Sealant layer 148 fills trenches 144 and is cured, forming a strong adhesive bond to liner layer 192 and passivation layer 120. Die 104 may then be singulated and packaged in a manner illustrated in FIGS. 7-8, and previously described. The resulting packaged device 196 is illustrated in FIG. 11 and features filled trench structure 160 formed in trench 144, and adhesively bonded to liner layer 192.

Figure 12:
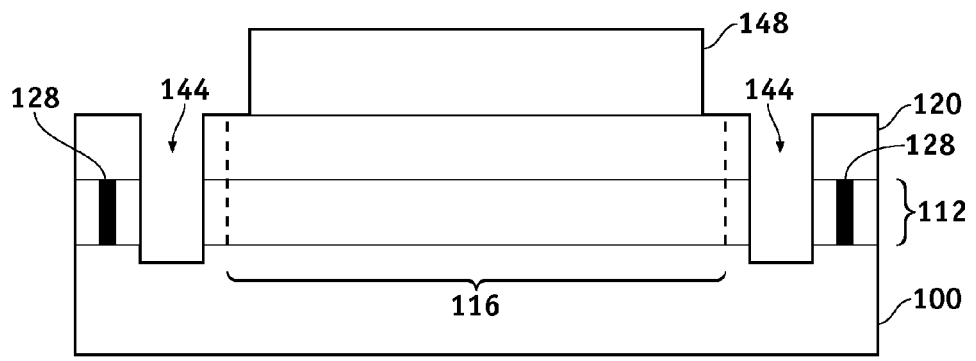
FIGS. 12-14, in conjunction with FIGS. 1-6, illustrate schematically, in cross-section, a semiconductor device and methods for fabricating a semiconductor device having a filled trench structure in accordance with another exemplary embodiment.
Figure 13:
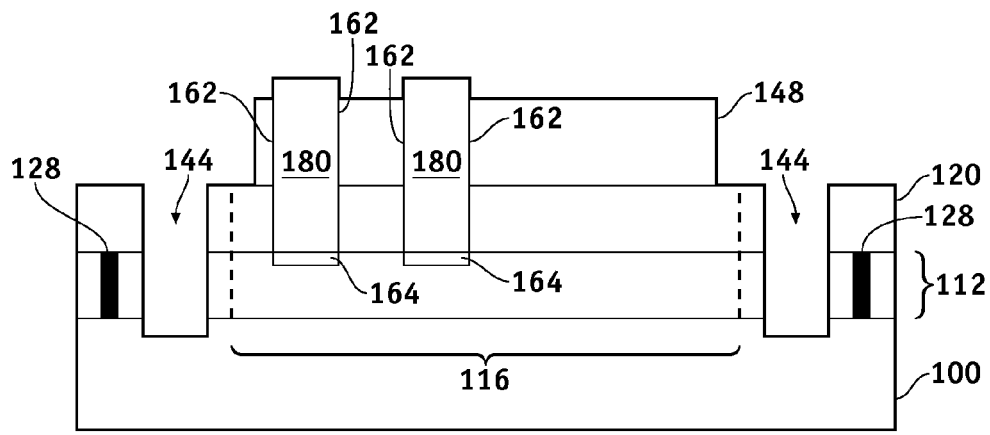
Figure 14:
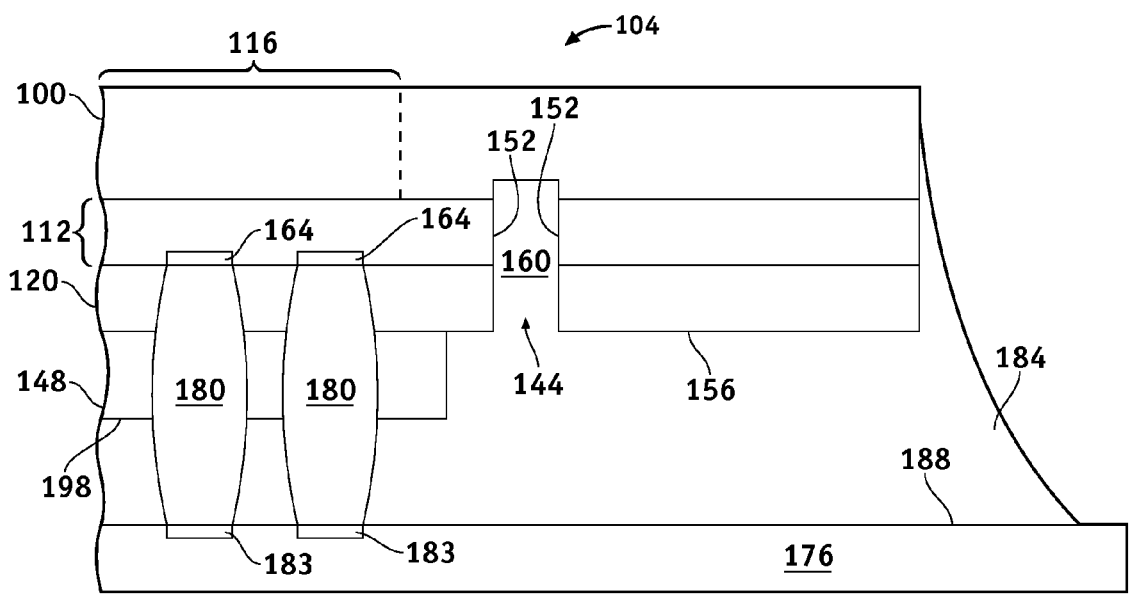

In another exemplary embodiment illustrated in FIGS. 12-14, a filled trench structure is formed of underfilling sealant following singulation during the packaging process. This method begins with steps that are illustrated in FIGS. 1-6, and previously described. Following the blanket application of sealant layer 148, layer 148 is patterned so as to remove sealant from regions of die 104 outside of active region 116 including from trench 144, scribe region 128, and any areas therebetween, as illustrated in FIG. 12. Sealant layer 148 may be patterned in any suitable manner including via a suitable lithography and etch process sequence that may include a hard mask layer if needed. In one embodiment, sealant layer 148 comprises a negative or positive acting photosensitive polyimide that may be patterned using a lithographic exposure followed by immersion in a suitable developer. Solder bumps 180 then are formed within openings 162 that access conductive terminals 164 through passivation layer 120 and sealant layer 148, as illustrated in FIG. 13 and previously described. Next, die 104 may be singulated by dicing through scribe regions 128 using a suitable sawing or laser scribing process.

Following dicing, die 104 is inverted and solder-bonded to packaging substrate 176 using a flip-chip bonding process, as illustrated in FIG. 14. Underfilling sealant 184 is administered between sealant layer 148 and surface 188 of packaging substrate 176, flowing between these surfaces and filling gaps between solder bumps 180, as previously described. However, because sealant layer 148 has been removed from trench 144, underfilling sealant 184 conformally fills trench 144, assuming the shape thereof. Underfilling sealant 184 then is oven-cured using a suitable baking process to harden sealant 184 and enhance bonding between various contacting surfaces including surfaces 152, 156, 188 and a surface 198 of sealant layer 148 to provide an environmental seal for die 104. Underfilling sealant also cures within trench 144 forming tough fracture resistant filled trench structure 160 that provides mechanical engagement between underfilling sealant 184 and die 104. Filled trench structure 160 inhibits the propagation of cracks formed in BEOL layer 112 and passivation layer 120, and provides improved adhesion with surface 156 of passivation layer 120 by adding a component of mechanical interlocking to the underfilling sealant and BEOL/passivation layer interfaces.

Figure 15:
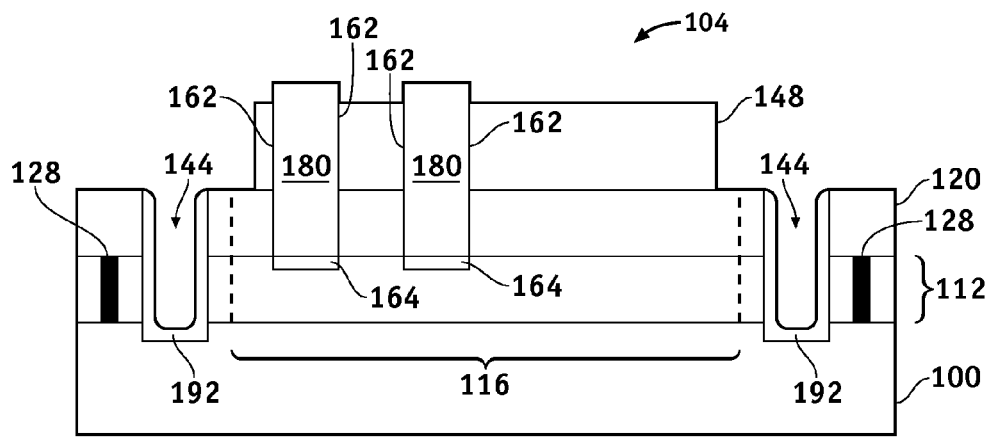
FIGS. 15-16, in conjunction with FIGS. 1-5 and FIGS. 9-10, illustrate schematically, in cross-section, a semiconductor device and methods for fabricating a semiconductor device having a filled trench structure in accordance with another exemplary embodiment.
Figure 16:
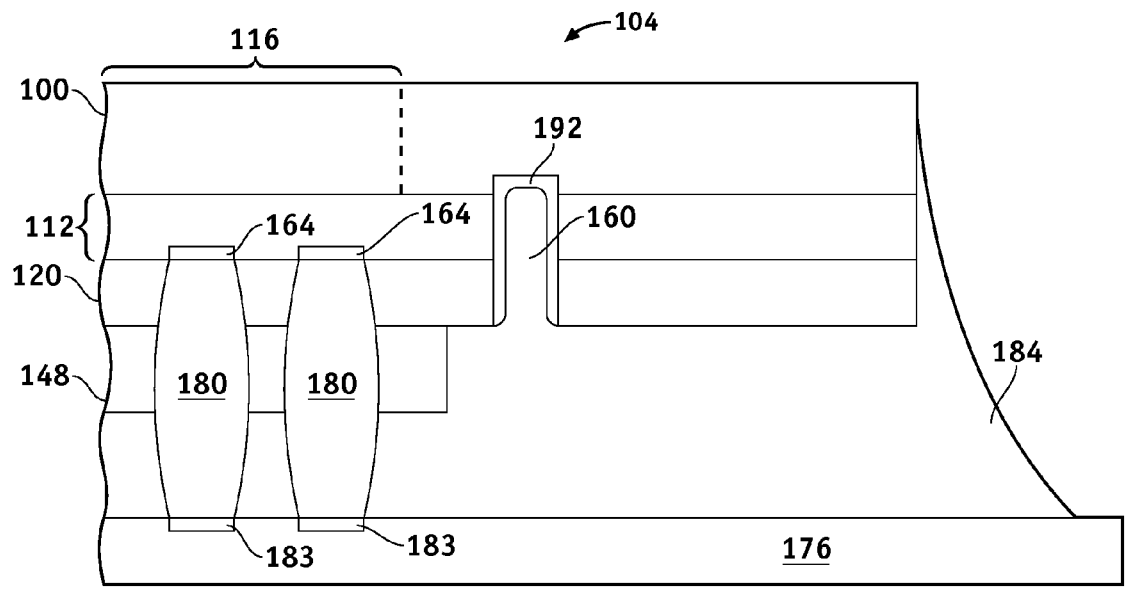

In another exemplary embodiment illustrated in FIG. 15-16, a liner layer is formed in trench 144 to promote adhesion between the filled trench structure 160 (FIG. 14) and underfilling sealant 184. This layer may also act as a diffusion barrier helping to prevent the migration of oxygen/water that may cause corrosion within the packaged die. This method begins with steps that are illustrated in FIGS. 1-4 or FIGS. 1-5, in conjunction with FIGS. 9-10, and previously described. Following the formation of liner layer 192 in trenches 144, and the blanket application of sealant layer 148 illustrated in FIG. 10, layer 148 is patterned in a manner previously described to remove sealant outside of active region 116 including trench 144 and scribe regions 128, as illustrated in FIG. 15. Following the formation of solder bumps 180 in openings 162 to access terminals 164, die 104 is diced and mounted to packaging substrate 176 using underfilling sealant 184, as illustrated in FIG. 16. Underfilling sealant 184 fills trench 144 and, when cured, forms structure 160. Liner layer 192 improves the adhesive bond strength between structure 160 and trench 144, and helps to prevent corrosion.

Figure 17:
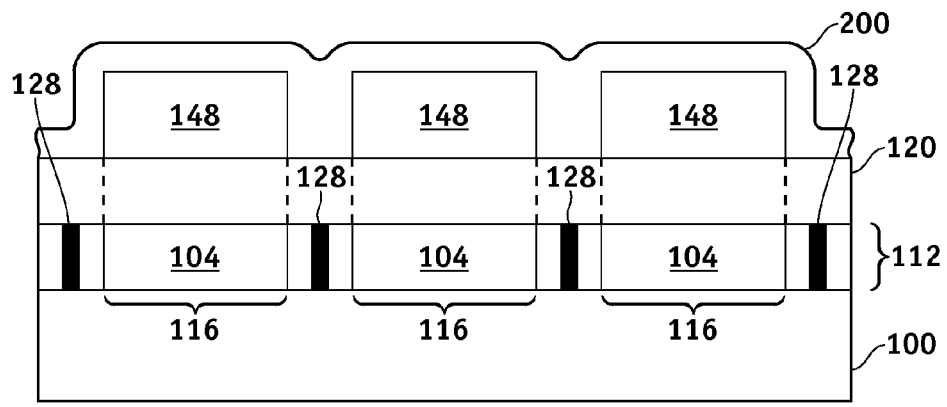
FIGS. 17-18, in conjunction with FIG. 1 and FIG. 14, illustrate schematically, in cross-section, a semiconductor device and methods for fabricating a semiconductor device having a filled trench structure in accordance with yet another exemplary embodiment.
Figure 18:
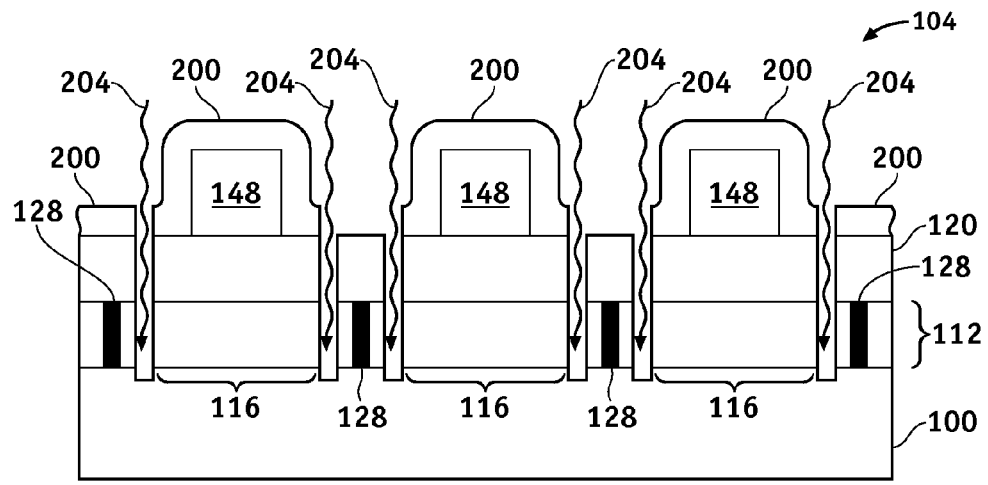

In another exemplary embodiment illustrated in FIGS. 17-18 taken in conjunction with FIG. 1 and FIG. 14, trench 144 used in the formation of a filled-trench structure is etched using a laser scribe system. This method begins by providing a substrate having a plurality of die 104 as previously described and illustrated in FIG. 1. Following the formation of passivation layer 120 overlying each of die 104 on substrate 100, sealant layer 148 is applied as a blanket coating overlying layer 120 and patterned as previously described to form a protective coating overlying active regions 116 of each die, as illustrated in FIG. 17. A protective layer 200 is formed as a blanket coating overlying sealant layer 148 and passivation layer 120. Protective layer 200 may be any suitable material used to protect these surfaces during a subsequent laser scribing process. Preferably protective layer 200 is a water soluble material such as, for example, HogoMax (available from Disco Co.) that may be applied using a spin coating and post application bake sequence.

Next, trenches 144 are formed in each of die 104 between active and scribe regions 116 and 128, respectively, using a laser scribing process, as illustrated in FIG. 18. Trenches 144 have a depth and width suitable to the formation of a mechanically engaging filled trench structure, and are typically cut at least through passivation layer 120 and BEOL layer 112. In one embodiment, trench 144 has a width of from about 5 μm to about 100 μm, and preferably is from about 5 μm to about 20 μm wide. In one embodiment, as shown, trenches 144 are formed through layers 120 and 112, and into silicon substrate 100. The depth and width of trenches 144 may be adjusted as desired by adjusting processing variables that include, but are not limited to, the power, focus, and/or pulse frequency of a scribing laser beam (represented by arrows 204), and the speed of a stage configured to transport the substrate. Following, formation of trenches 144, protective layer 200 is removed.

Solder bumps 180 are formed through layers 120 and 148 to access terminals 164 as previously described, and individual die 104 are then separated from substrate 100 using a suitable dicing process. Die 104 then are mounted to packaging substrate 176 using solder-bonding and underfilling sealant 184, as illustrated in FIG. 14. Such mounting can be performed using a conventional flip-chip bonding scheme described previously. Underfilling sealant 184 fills trench 144 and is cured to form filled trench structure 160. As described above, filled trench structure 160 provides a tough and fracture resistant barrier to crack propagation, and improves adhesive bond strength between underfilling sealant 184 and BEOL/passivation layers 112 and 120, respectively, by adding mechanical interlocking to these interfaces.

Accordingly, the embodiments described herein provide novel methods for fabricating semiconductor die having filled-trench structures. A filled trench structure is formed using a trench which protrudes through passivation and BEOL layers of a semiconductor die and is filled with a tough and fracture resistant sealing material. The filled trench structure mechanically engages these layers, anchoring the sealant to the die and improving the adhesive and mechanical bond strength at the die/sealant interface. Further, sealants used to form the filled trench structure are tough and fracture resistant and thereby form a barrier that inhibits edge cracks from propagating into the active region. The trench used to form the filled trench structure may be generated using a variety of methods including dry and/or wet etching or laser scribing processes. The sealant used to fill the trench may include a polyimide or other coating formed conventionally within a fab setting, or an underfilling sealant normally associated with die packaging and used in a final assembly setting. The profile of the trench may be varied and/or the trench may be lined with an adhesion promoting layer to further enhance adhesive bond strength and environmental sealing between the filled trench structure and the die. Accordingly, these methods may be integrated into a conventional fabrication process sequence to improve the reliability of such devices.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method of fabricating a semiconductor device comprising the steps of:
   providing a semiconductor die comprising a semiconductor substrate having a first surface;
   forming a trench in the semiconductor substrate and the first surface of the die;
   electrically and physically coupling the die to a packaging substrate such that the first surface and trench are oriented toward the packaging substrate;
   forming a sealant layer on the first surface of the die to form an engagement structure within the trench, wherein the engagement structure is formed of the sealant layer; and
   infusing underfill directly between the sealant layer and the packaging substrate.

2. The method of claim 1, further comprising the step of heating the sealant layer.

3. The method of claim 1, wherein the step of forming a sealant layer comprises forming a polyimide sealant layer.

4. The method of claim 1, further comprising the step of dicing the die from a semiconductor substrate.

5. The method of claim 4, wherein the step of dicing the die is performed after the step of forming a sealant layer.

6. The method of claim 1, further comprising the step of depositing a liner layer in the trench after the step of forming a trench.

7. The method of claim 6, wherein the step of depositing a liner layer comprises depositing a liner layer having a composition selected from a group consisting of Ta, TaN, Ti, TiN, TiW, Cr, CrCu, TaSiN, Re, Co, CoW, CoWP, and silicon nitrides.

8. The method of claim 1, wherein the step of forming a trench comprises isotropically etching to form the trench.

9. The method of claim 1, wherein the step of forming a trench comprises anisotropically etching to form the trench.

10. A method of fabricating a semiconductor device comprising the steps of:
    providing a semiconductor die comprising a semiconductor substrate and having a first surface and an active region;
    forming a trench in semiconductor die, wherein the trench extends from the first surface of the semiconductor die into the semiconductor substrate and a region of the semiconductor die that is outside of the active region;
    electrically and physically coupling the active region of the semiconductor die to a packaging substrate such that the first surface and the trench are oriented toward the packaging substrate;
    forming a first sealant layer on the first surface to form a filled trench structure within the trench; and
    forming a second sealant layer disposed directly between the filled trench structure and the packaging substrate.

11. The method of claim 10, wherein the step of forming a filled trench structure is performed during the step of forming a second sealant layer.

12. The method of claim 10, wherein the step of forming a filled trench structure is performed during the step of forming a first sealant layer.

13. The method of claim 10, further comprising the step of depositing a liner layer in the trench.

14. The method of claim 13, wherein the step of depositing a liner layer comprises depositing a liner layer having a composition selected from a group consisting of Ta, TaN, Ti, TiN, TiW, Cr, CrCu, TaSiN, Re, Co, CoW, CoWP, and silicon nitrides.

15. The method of claim 10, wherein the step of forming a trench comprises forming a trench using a laser scribing process.

16. An electronic device comprising:
    a packaging substrate;
    a semiconductor die comprising a semiconductor substrate and having a trench formed in the semiconductor substrate and a first surface, the first surface electrically and physically coupled to the packaging substrate such that the first surface and trench are oriented towards the packaging substrate; and
    a sealant layer disposed in the trench and between the packaging substrate and the first surface of the semiconductor die, wherein the sealant layer disposed in the trench forms an engagement structure within the trench; and
    an underfill sealant directly between the sealant layer and the packaging substrate.

17. A method of fabricating a semiconductor device comprising the steps of:
    providing a semiconductor die comprising a semiconductor substrate and having a first surface;
    electrically and physically coupling the die to a packaging substrate such that the first surface is oriented toward the packaging substrate;
    forming a sealant layer on the first surface of the die;
    forming a trench in the semiconductor substrate and the first surface of the die such that the trench is oriented toward the packaging substrate; and
    infusing underfill directly between the sealant layer and the packaging substrate to form an engagement structure within the trench, wherein the engagement structure is formed of underfill.

18. The method of claim 17, further comprising the step of heating the sealant layer.

19. The method of claim 17, further comprising the step of depositing a liner layer in the trench after the step of forming a trench.

20. The method of claim 19, wherein the step of depositing a liner layer comprises depositing a liner layer having a composition selected from a group consisting of Ta, TaN, Ti, TiN, TiW, Cr, CrCu, TaSiN, Re, Co, CoW, CoWP, and silicon nitrides.

* * * * *